United States Patent
Kitagawa et al.

(10) Patent No.: US 9,209,043 B2
(45) Date of Patent: Dec. 8, 2015

(54) SEMICONDUCTOR MANUFACTURING METHOD AND SEMICONDUCTOR MANUFACTURING APPARATUS

(71) Applicant: Panasonic Intellectual Property Management Co., Ltd., Osaka (JP)

(72) Inventors: Dai Kitagawa, Osaka (JP); Tomohiro Okumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/682,083

(22) Filed: Apr. 8, 2015

(65) Prior Publication Data
US 2015/0325455 A1    Nov. 12, 2015

(30) Foreign Application Priority Data

May 8, 2014   (JP) .................. 2014-096866

(51) Int. Cl.
*H01L 21/324*    (2006.01)
*H01L 21/67*    (2006.01)
*H01L 21/268*    (2006.01)

(52) U.S. Cl.
CPC .......... *H01L 21/324* (2013.01); *H01L 21/268* (2013.01); *H01L 21/67115* (2013.01)

(58) Field of Classification Search
CPC ................ H01L 21/268; H01L 21/324; H01L 21/67115
See application file for complete search history.

(56) References Cited

U.S. PATENT DOCUMENTS

| | | | | |
|---|---|---|---|---|
| 5,923,409 A | * | 7/1999 | Hamada | G03B 27/58 355/53 |
| 6,184,060 B1 | * | 2/2001 | Siniaguine | H01L 21/441 257/690 |
| 2005/0214973 A1 | | 9/2005 | Oyu et al. | |
| 2007/0158784 A1 | | 7/2007 | Oyu et al. | |
| 2008/0138535 A1 | | 6/2008 | Hwang | |
| 2012/0325777 A1 | | 12/2012 | Okumura et al. | |
| 2013/0115780 A1 | | 5/2013 | Okumura et al. | |
| 2014/0220784 A1 | | 8/2014 | Okumura et al. | |

FOREIGN PATENT DOCUMENTS

| | | |
|---|---|---|
| JP | 2007-287452 | 11/2007 |
| JP | 2010-153903 | 7/2010 |
| JP | 2013-120684 | 6/2013 |
| WO | 2011/142125 | 11/2011 |

* cited by examiner

*Primary Examiner* — Daniel Shook
(74) *Attorney, Agent, or Firm* — Panasonic Patent Center (57) ABSTRACT

In a semiconductor manufacturing method for performing thermal treatment of a substrate with plasma while moving the substrate on which devices are formed relatively to a plasma generating apparatus which generates the plasma by allowing electromagnetic fields to act on a plasma gas, a second surface of the substrate is irradiated with the plasma of the plasma generating apparatus in a state where the second surface of the substrate which is the opposite side of a first surface of the substrate on which the devices are formed faces the plasma generating apparatus.

5 Claims, 11 Drawing Sheets

SEMICONDUCTOR MANUFACTURING METHOD AND SEMICONDUCTOR MANUFACTURING APPARATUS

TECHNICAL FIELD

The present disclosure relates to a semiconductor manufacturing method and a semiconductor manufacturing apparatus for performing thermal treatment by irradiating a substrate with plasma.

BACKGROUND

In a manufacturing process of a semiconductor device, an impurity introduction process for introducing impurities into a substrate is executed for forming, for example, an n-type semiconductor and a p-type semiconductor. After the introduction of impurities, an annealing process (thermal treatment) is executed.

For example, when using a silicon wafer as a substrate, an ion implantation process for implanting ions into the wafer by allowing impurity ions to collide with the wafer and the annealing process for coupling the implanted impurities with silicon are executed.

It is necessary to suppress the diffusion of impurities into a deep part in the substrate for miniaturizing the semiconductor device and for improving the performance thereof. For that purpose, it is required that the impurities are introduced to a shallow region near the surface of the substrate with high density as well as the annealing process for coupling the impurities with silicon be performed for a short period of time. When the thermal treatment is performed for a long period of time, the impurities are diffused to the deep part of the substrate. As a result, it is difficult to fabricate a good semiconductor device. Accordingly, a technique of performing annealing process for a short period of time is required.

As a technique of performing annealing process for a short period of time, for example, a heating technique using laser is used. In the case of heating using the laser, a heating target can be heated to 1000° C. or more for a short period of time as the order of μs.

However, as there is a limit in continuous output time of laser at present, it is necessary to emit the laser plural times when the surface of a large-sized substrate is scanned with the laser to heat the substrate. Accordingly, there is a case where the degree of heating differs in plural portions of the substrate which has been scanned with laser emitted at different timings. That is, heating unevenness of substrate may occur. As a result, semiconductor devices to which the annealing process has been sufficiently performed and semiconductor devices to which the annealing process has been insufficiently performed are fabricated.

A semiconductor manufacturing apparatus capable of solving the problem of the annealing process by the laser is disclosed in JP-A-2013-120684 (Patent Document 1). The semiconductor manufacturing apparatus described in Patent Document 1 is configured to move a substrate relatively to a plasma torch unit so that the substrate crosses the front of an opening of the plasma torch unit for emitting plasma. The opening for emitting plasma has a slot shape elongated in a direction orthogonal to the moving direction of the substrate, which is longer than a width (size in the direction orthogonal to the moving direction) of the substrate. The plasma is emitted from the opening in a line shape onto the surface of the substrate on which semiconductor devices are formed. Therefore, the surface of the substrate is scanned once with the line-shaped plasma, thereby heating the entire substrate uniformly without occurrence of heating unevenness. As a result, the annealing process is performed uniformly with respect to plural semiconductor devices on the substrate.

SUMMARY

However, in the case of the plasma processing apparatus described in Patent Document 1, there is a possibility that the semiconductor devices formed on the substrate are damaged. Specifically, the semiconductor devices formed on a thin film of the substrate may be electrostatically damaged due to strong electromagnetic fields formed by coils for generating plasma. The electrostatic damage in this case means the reduction of performance as a result of accumulation of electric charges in the semiconductor devices due to the electromagnetic fields.

In view of the above, a concern of the present disclosure is suppressing the damage to the semiconductor devices caused by electromagnetic fields when generating plasma by electromagnetic fields and performing an annealing process to semiconductor devices on a substrate by using the plasma.

According to an embodiment, there is provided a semiconductor manufacturing method performing thermal treatment of a substrate by using plasma while moving the substrate on which devices are formed relatively to a plasma generating apparatus which generates plasma by allowing electromagnetic fields to act on a plasma gas, which includes the step of irradiating a second surface of the substrate with plasma of the plasma generating apparatus in a state where the second surface of the substrate which is the opposite side of a first surface of the substrate on which the devices are formed faces the plasma generating apparatus.

Also according to the embodiment, there is provided a semiconductor manufacturing apparatus performing thermal treatment of a substrate on which semiconductor devices are formed with plasma, which includes a plasma generating apparatus which generates plasma by allowing electromagnetic fields to act on a plasma gas, a substrate holder which holds the substrate and a movement mechanism which moves the substrate holder, in which a second surface of the substrate is irradiated with plasma of the plasma generating apparatus while moving the substrate holder relatively to the plasma generating apparatus by the movement mechanism so that a normal line of the second surface of the substrate which is the opposite side of a first surface of the substrate on which the semiconductor devices are formed extends in a horizontal direction as well as the second surface faces the plasma generating apparatus.

According to the present disclosure, it is possible to suppress the damage to semiconductor devices caused by electromagnetic fields when generating plasma by electromagnetic fields and performing an annealing process to semiconductor devices on a substrate by using the plasma.

DESCRIPTION OF EMBODIMENTS

Hereinafter, embodiments of the present invention will be explained with reference to the drawings.

Embodiment 1

Figure 1:
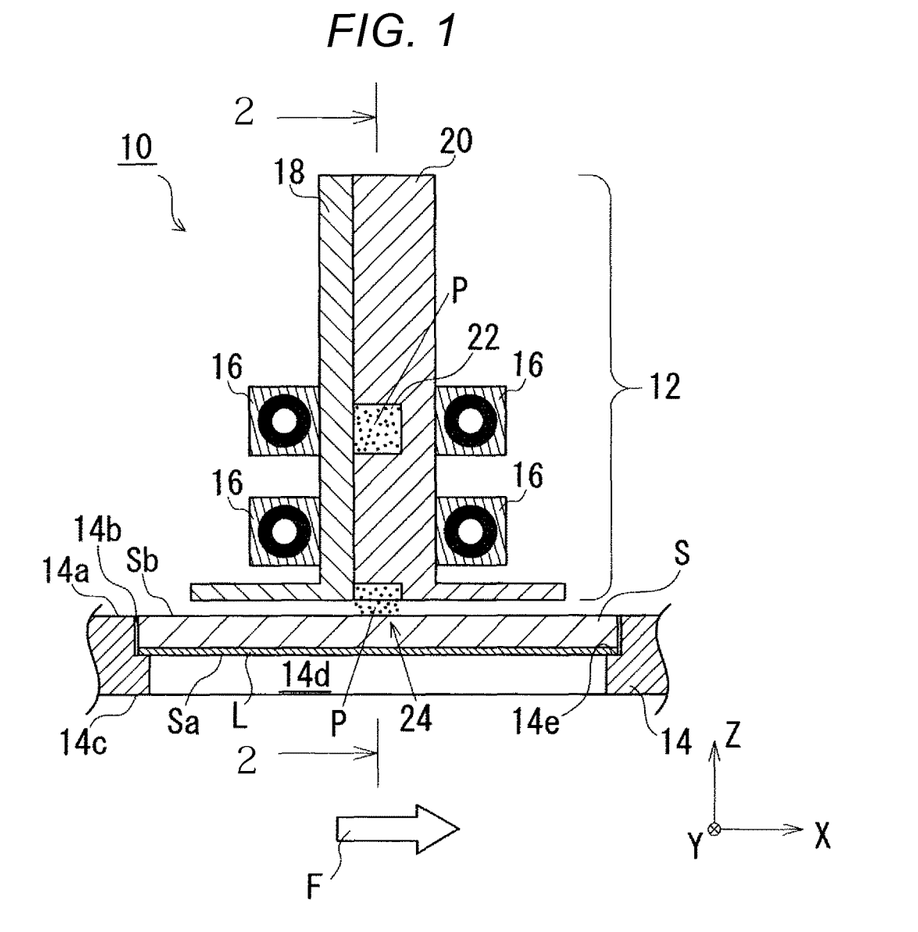
FIG. 1 is a schematic view of a semiconductor manufacturing apparatus according to Embodiment 1.
Figure 2:
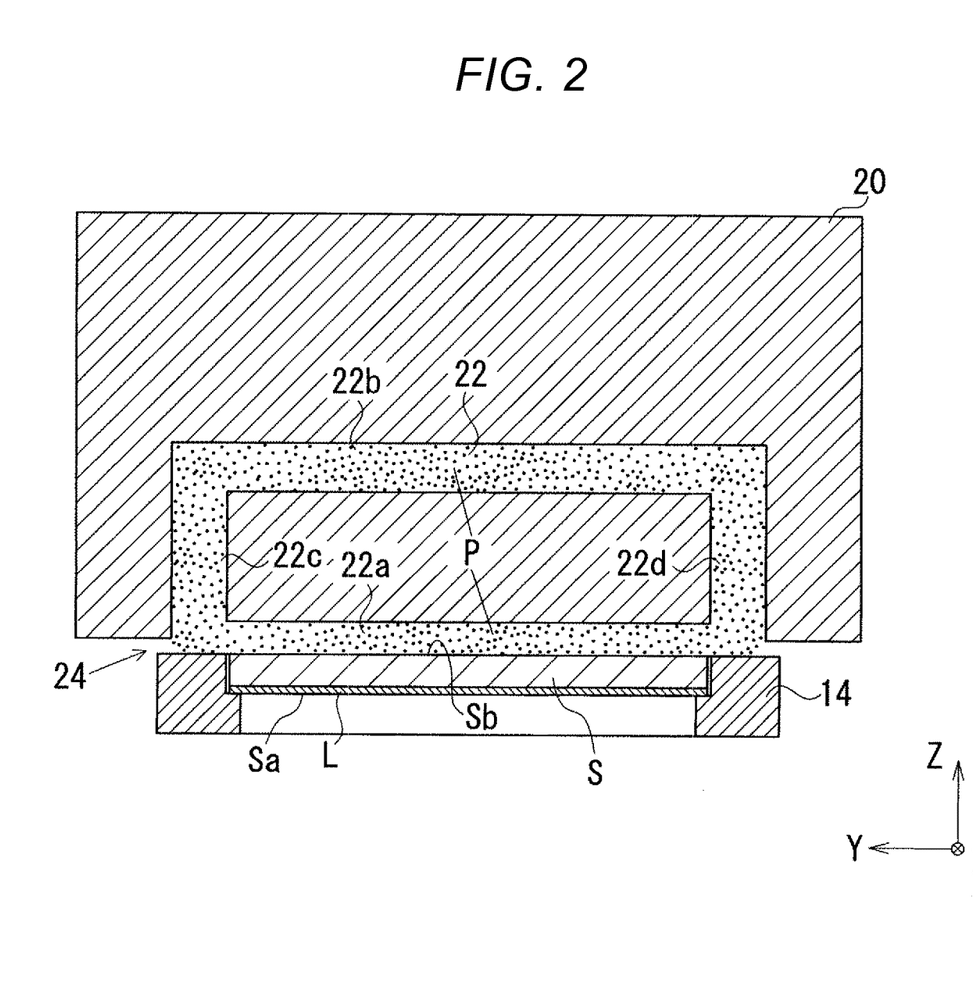
FIG. 2 is a cross-sectional view of the semiconductor manufacturing apparatus taken along 2-2 line in FIG. 1.
Figure 3A:
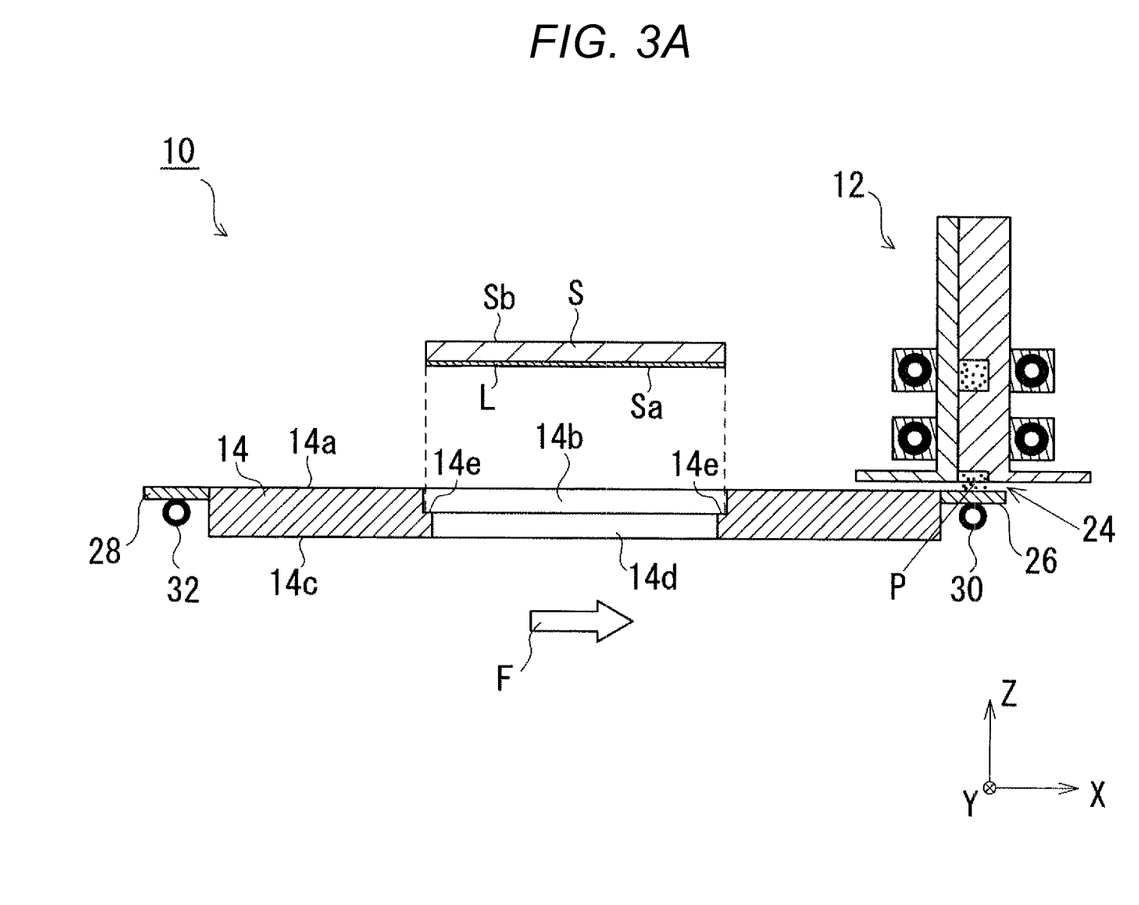
FIG. 3A is a view showing the semiconductor manufacturing apparatus before starting a thermal treatment.
Figure 3B:
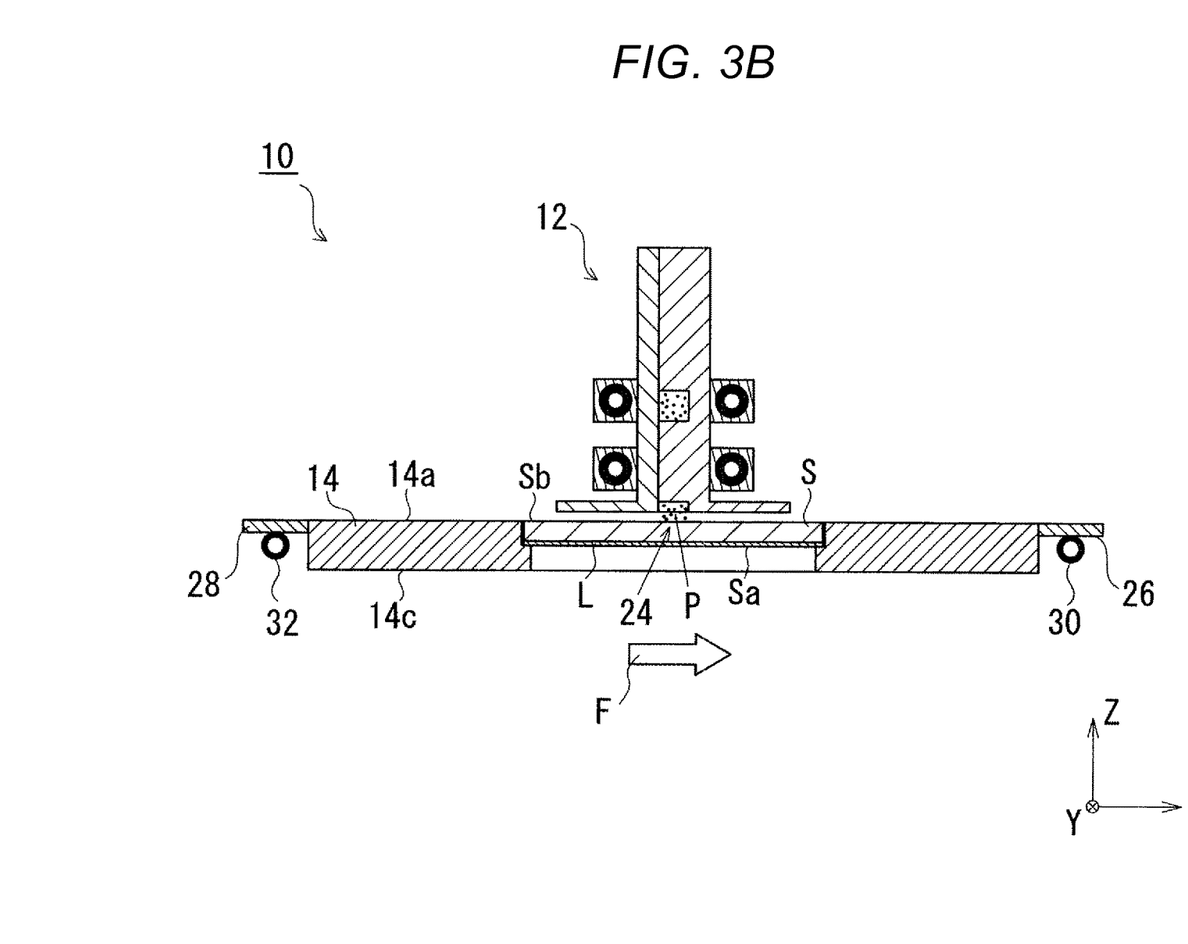
FIG. 3B is a view showing the semiconductor manufacturing apparatus during the thermal treatment.
Figure 3C:
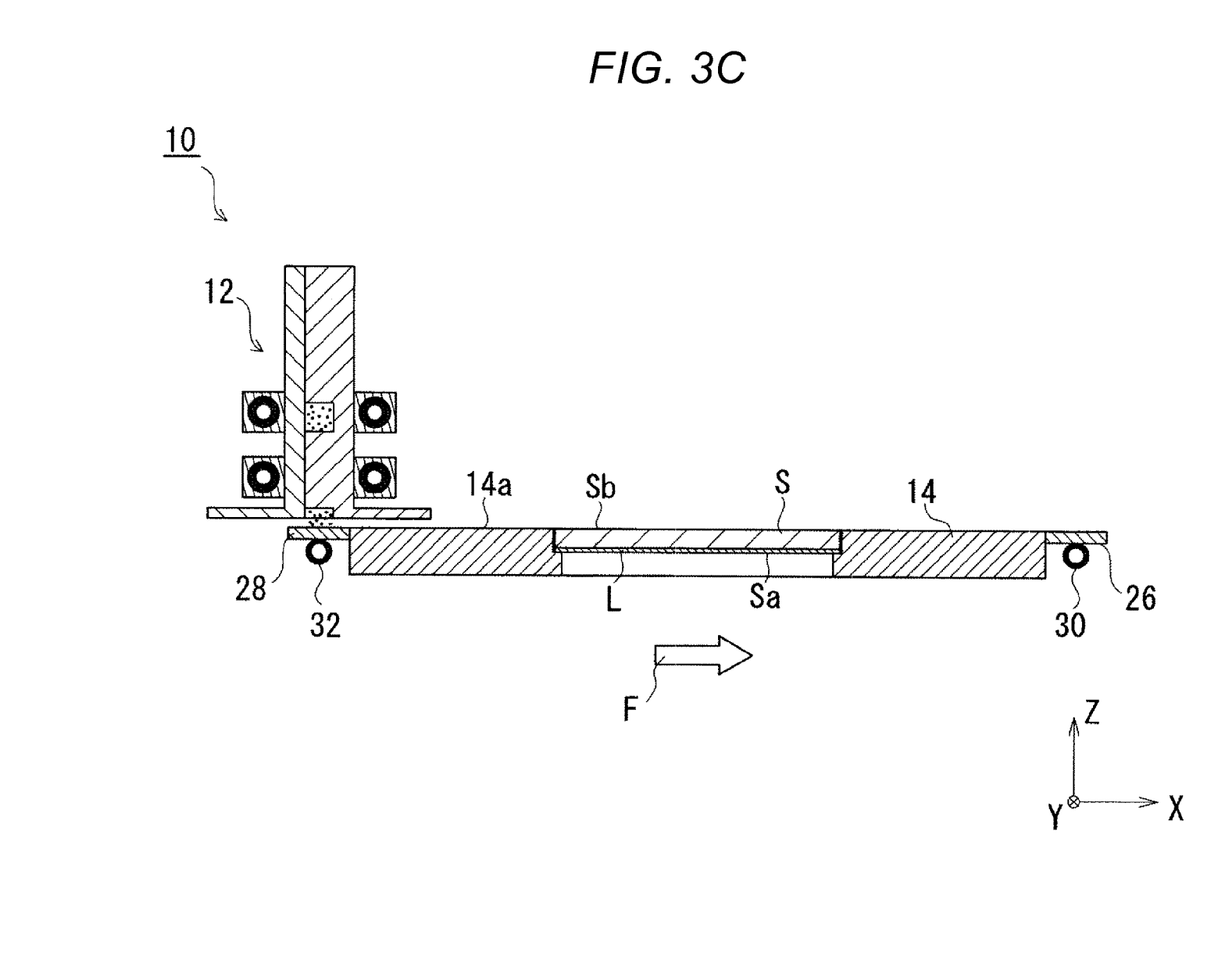
FIG. 3C is a view showing the semiconductor manufacturing apparatus after the thermal treatment is completed.

FIG. 1 schematically shows a semiconductor manufacturing apparatus according to Embodiment 1. FIG. 2 shows a cross section taken along 2-2 line in FIG. 1. FIG. 3A to FIG. 3C show the flow of a thermal treatment (annealing process) by the semiconductor manufacturing apparatus. A Z-axis direction indicates a vertical direction, an X-axis direction and a Y-axis direction indicate a horizontal direction in the drawing.

A semiconductor manufacturing apparatus 10 shown in FIG. 1 includes an inductively-coupled plasma torch unit 12 (hereinafter referred to as a "plasma torch unit 12") as a plasma generating apparatus for performing thermal treatment of a substrate S with a plasma P and a substrate holder 14 holding the substrate S.

The substrate S is, for example, a silicon wafer which is often used in manufacturing of semiconductors. The substrate S has a thin film L on which semiconductor devices (strictly, intermediate products of semiconductor devices in a state before an annealing process is performed) are formed on a first surface Sa side.

The substrate S is held by the substrate holder 14, and the substrate holder 14 holding the substrate S is relatively moved (transferred) with respect to the plasma torch unit 12. In the case of Embodiment 1, the substrate holder 14 holding the substrate S is moved in the X-axis direction (an outline arrow direction F) relatively to the fixed plasma torch unit 12. A movement mechanism for moving the substrate holder 14 relatively to the plasma torch unit 12 is, for example, configured by plural rollers (not shown) rotating with outer peripheral surfaces contacting the substrate holder 14, though not being limited to this. It is also preferable that the plasma torch unit 12 is moved relatively to the fixed substrate holder 14. Furthermore, both the plasma torch unit 12 and the substrate holder 14 may be moved.

In the case of Embodiment 1, the substrate holder 14 is provided with a concave portion 14b having a cross-sectional shape capable of housing the substrate S and similar to the shape of the substrate S in a surface 14a facing the plasma torch unit 12 as shown in FIG. 3A. The substrate holder 14 is also provided with a through hole 14d allowing a bottom of the concave portion 14b to be communicated with a surface 14c as the reverse side of the substrate holder 14, through which the substrate S does not pass. That is, the concave portion 14b and the through hole 14d make a counterbored hole.

As shown in FIG. 1, the substrate holder 14 holds the substrate S so that a second surface Sb of the substrate S which is the opposite side of the first surface Sa including the thin film L on which semiconductor devices are formed faces the plasma torch unit 12. That is, second surface Sb of the substrate S on which the thin film L is not formed is irradiated with the plasma P from the plasma torch unit 12, the reason of which will be explained later. The substrate holder 14 also supports a peripheral portion of the first surface Sa of the substrate S on which the thin film L is formed by a shoulder portion 14e formed between the concave portion 14b and the through hole 14d. Accordingly, the movement of heat from the substrate S heated by the plasma torch unit 12 to the substrate holder 14 is suppressed.

A depth of the concave portion 14b of the substrate holder 14 is approximately equal to a thickness of the substrate S so that the surface 14a of the substrate holder 14 and the second surface Sb of the substrate S are positioned on approximately the same plane as shown in FIG. 1, the reason of which will be explained later.

The plasma torch unit 12 includes coils 16 made of a conductor for forming electromagnetic fields, a first ceramic block 18 made of a dielectric and a second ceramic block 20 made of a dielectric as shown in FIG. 1.

The coils 16 are formed of, for example, copper pipes having a circular cross section and copper blocks covering the copper pipes and having a rectangular (or square-shaped) cross section. The coils 16 are arranged in the vicinity of a first ceramic block 18 and a second ceramic block 20. A refrigerant for cooling the coils 16 flows in the copper pipes.

The first ceramic block 18 and the second ceramic block 20 contact each other. A chamber 22 and a slot-shaped opening 24 communicated into the chamber 22 are demarcated between the ceramic blocks.

Specifically, the chamber 22 and the opening 24 of the plasma torch unit 12 are provided along a plane (Y-Z plane) orthogonal to the second surface Sb of the substrate S to be irradiated with the plasma P. The opening 24 is an opening having a slot shape elongated in a direction (Y-axis direction) parallel to the plane (Y-Z plane) extending along the chamber 22 and the opening 24 and the surface Sb of the substrate S. That is, the opening 24 is an opening a longitudinal direction of which is orthogonal to a relative movement direction (feeding direction F) of the substrate S with respect to the plasma torch unit 12.

The opening 24 approaches the second surface Sb of the substrate S as close as possible in parallel to the second surface Sb of the substrate S at the time of plasma processing. As a result, the opening 24 is substantially closed by the substrate S, and the chamber 22 becomes a substantially closed space accordingly.

The coil 16 is formed so that the central axis thereof extends in parallel to the second surface Sb of the substrate S as well as orthogonal to the plane (Y-Z plane) extending along the chamber 22 and the opening 24 (in other words, the central axis of the coil 16 extends in the X-axis direction).

Also in the case of Embodiment 1, the coils 16 are arranged in the outer side of the first ceramic block 18 and in the outer side of the second ceramic block 20 respectively. The respective two coils 16 are formed so that directions of high-frequency electromagnetic fields formed in the chamber 22 by respective coils 16 when the high-frequency power is applied are equal to each other.

The device can function only by any one of the two coils 16. However, the strength of the electromagnetic fields formed in the chamber 22 can be increased more in the case where two coils 16 are provided so as to sandwich the chamber 22 as in Embodiment 1.

In the case of Embodiment 1, the chamber 22 is formed in an annular shape as shown in FIG. 2. The "annular shape" in this case means an endless shape, not limited to a circular shape. For example, the chamber 22 is communicated with the opening 24, including a straight line portion 22a extending in a longitudinal direction (Y-axis direction) of the opening 24, a straight line portion 22b extending in parallel to the straight line portion 22a with a gap and straight line portions 22c, 22d connecting the two straight line portions 22a and 22b.

A plasma gas is introduced into the chamber 22 of the above plasma torch unit 12. Various kinds of gases can be used as the plasma gas, but it is preferable to use a gas mainly containing an inert gas as the plasma gas when considering stability and ignition performance of plasma P, lifetime of members exposed with plasma P and so on. For example, an argon (Ar) gas can be cited as the plasma gas.

For example, when only the argon gas is used as the plasma gas, the plasma P will be a considerably high temperature (10,000K or more).

For example, when a mixed gas including argon and hydrogen ($H_2$) is used, appropriate values are approximately: scanning speed (movement speed of the substrate S)=50 to 3000 mm/s, the total flow of the plasma gas=1 to 100SLM, $H_2$ density=0 to 10%, and high frequency power applied to the coils 16=0.5 to 50 kW as conditions for generating the plasma. However, the gas flow and the power in these values show values per a length 100 mm of the opening 24 of the plasma torch unit 12 in the longitudinal direction (Y-axis direction). Therefore, in the case where the length of the opening 24 in the longitudinal direction is shorter or longer than 100 mm, it is necessary to adjust parameters such as the gas flow and the power in proportion to the length.

In the plasma torch unit 12 having the above structure, high-frequency electromagnetic fields are formed inside the chamber 22 to which the plasma gas is introduced when the high-frequency power is applied to the coils 16. Accordingly, the high-frequency electromagnetic fields act on the plasma gas, and the plasma P is generated (the plasma P is ignited) inside the chamber 22, that is, in a space surrounded by the first ceramic block 18, the second ceramic block 20 and the second surface Sb of the substrate S. The generated plasma P is emitted to the second surface Sb of the substrate S through the opening 24.

The plasma torch unit 12 does not ignite the plasma P in a state where the second surface Sb of the substrate S faces the opening 24. Specifically, the plasma P is ignited before the substrate S crosses the front of the opening 24 of the plasma torch unit 12 in the feeding direction F as shown in FIG. 3A.

Specifically, a first ceramic plate 26 and a second ceramic plate 28 having an excellent heat resistance property are attached to a front end and a rear end of the substrate holder 14 in the feeding direction F as shown in FIG. 3A. Surfaces of the first and second ceramic plates 26 and 28 in the plasma torch unit 12 side are positioned on approximately the same plane as the surface 14a of the substrate holder 14a and the second surface Sb of the substrate S in the plasma torch unit 12 side.

The plasma P is ignited in a state where the first ceramic plate 26 in the front side in the feeding direction F faces the opening 24 of the plasma torch unit 12. A refrigerant pipe 30 in which a refrigerant flows is attached to the first ceramic plate 26. As the refrigerant pipe 30 is provided, the first ceramic plate 26 is cooled so that the first ceramic plate 26 is not thermally damaged by the plasma P.

When the plasma P is ignited, the substrate holder 14 is started to be carried (started to be accelerated) in the feeding direction F. The substrate holder 14 is accelerated so that the second surface Sb of the substrate S crosses the front of the opening 24 of the plasma torch unit 12 at a given fixed speed as shown in FIG. 3B. Accordingly, the entire second surface Sb of the substrate S is scanned with the plasma P irradiated from the opening 24 of the plasma torch unit 12 at the fixed speed.

The size of the opening 24 of the plasma torch unit 12 in the longitudinal direction (Y-axis direction) is longer than the size of the substrate S in a direction orthogonal to the feeding direction F. Accordingly, the plasma P is irradiated to the substrate S in a long line shape as compared with the size of the substrate S. As a result, the plasma processing can be performed to the entire second surface Sb of the substrate S only by scanning the second surface Sb of the substrate S with the plasma P once, and the entire substrate S is thermally treated uniformly as compared with the case where the entire second surface Sb of the substrate S is scanned with the plasma P plural times.

As the surface of the first ceramic plate 26, the surface 14a of the substrate holder 14 and the second surface Sb of the substrate S which are scanned with the plasma P are positioned on the same plane, the state of the plasma P inside the chamber 22 becomes stable while the plasma torch unit 12 relatively moves from the first ceramic plate 26 toward the substrate S. Accordingly, the fluctuation of the plasma P occurring by the movement can be suppressed and variations in thermal treatment with respect to the substrate S can be also suppressed.

After the substrate S crosses the front of the opening 24 of the plasma torch unit 12, the substrate holder 14 is decelerated. Then, the substrate 14 is stopped in a state where the second ceramic plate 28 faces the opening 24 of the plasma torch unit 12 as shown in FIG. 3C. The second ceramic plate 28 is also cooled by a refrigerant pipe 32 in which the refrigerant flows in the same manner as the first ceramic plate 26.

In the case where the supply of high-frequency power to the coils 16 is stopped immediately after the substrate S crosses the front of the opening 24 of the plasma torch unit 12, it is possible to omit the refrigerant pipe 32 and to omit the cooling of the second ceramic plate 28. It is also possible to omit not only the refrigerant pipe 32 but also the second ceramic plate 28.

After the opening 24 of the plasma torch unit 12 comes to face the second ceramic plate 28, the supply of high-frequency power to the coils 16 is stopped and the substrate S which is thermally treated by the plasma P is taken out of the substrate holder 14.

According to the plasma processing (thermal treatment) using the above semiconductor manufacturing apparatus 10, the second surface Sb of the substrate S is irradiated with the plasma P during a short period of time which is several dozen ms to several hundred ms, which can increase the temperature of the second surface Sb to 1000° C. or more instantly. The thickness of the substrate S (for example, the silicon wafer) having a size which is often used in semiconductor manufacturing processes is the order of several hundred μm, therefore, when the second surface Sb is heated instantly to 1000° C. or more, the temperature of the entire substrate S is also increased instantly to approximately the same temperature. As a result, the annealing process can be executed to the semiconductor devices (strictly, intermediate products of semiconductor devices in a state before the annealing process is performed) formed on the thin film L of the first surface Sa of the substrate S without being irradiated with the plasma P directly.

As the substrate S itself exists between the thin film L on which (the intermediate products of) the semiconductor devices requiring the annealing process are formed and the plasma torch unit 12 irradiating the plasma P as shown in FIG. 1 and FIG. 2, the semiconductor devices formed on the thin film L are hardly damaged electrostatically by high-frequency electromagnetic fields formed by the coils 16.

As specific explanation of the above, an eddy current is generated in the substrate S due to the high-frequency electromagnetic fields formed by the coils 16. The substrate S in which the eddy current is generated functions as an electromagnetic shield, which can effectively shield the semiconductor devices formed on the thin film L from electromagnetic waves generated by the coils 16. Accordingly, the high-frequency electromagnetic fields derived from the coils 16 in the vicinity of the thin film L are substantially reduced. As a result, the semiconductor devices formed on the thin film L of the substrate S are hardly damaged electrostatically by the high-frequency electromagnetic fields formed by the coils 16, and good semiconductor devices can be fabricated.

The inventors have demonstrated by experiments that the electrostatic damage to the semiconductor devices formed on the thin film L which is caused by the high-frequency electromagnetic fields formed by the coils 16 can be suppressed.

Specifically, a MOS device with an antenna ratio of a million times magnification was fabricated as the semiconductor device on the thin film L (insulating thin film) on the first surface Sa of the substrate S. The second surface Sb of the substrate S was irradiated with the plasma P. The first substrate Sa of another substrate S was irradiated with the plasma P for comparison. In respective cases, electric charges on the thin film L of the substrate S after the plasma irradiation were measured by the Kelvin probe method.

As a result, when the second surface Sb of the substrate S was irradiated with the plasma P, the MOS device formed on the thin film L of the first surface Sa was not damaged. Additionally, electric charges were hardly generated on the thin film L, and measurement values of electric charges were ±3V or less.

On the other hand, when the first surface Sa of the substrate S was irradiated with the plasma P, the MOS device formed on the thin film L of the first surface Sa was damaged. Electric charges of +10 to 30V were generated on the thin film L. It is found that the MOS device with the antenna ratio of a ten thousand times magnification is damaged when the first surface Sa of the substrate S is irradiated with the plasma S.

As described above, it is found that the electrostatic damage to the device can be suppressed when the surface of the substrate which is the opposite side of the surface of the substrate on which the device is formed is irradiated with the plasma.

According to the present Embodiment 1, it is possible to suppress the damage to the semiconductor devices caused by the electromagnetic fields when the plasma P is generated by the electromagnetic fields and the annealing process is executed to the semiconductor devices on the substrate S by using the plasma P. Moreover, as the first surface Sa on which the semiconductor devices are formed faces downward, the contamination to the semiconductor devices can be suppressed, as a result, high-performance semiconductor devices can be obtained.

Embodiment 2

Embodiment 2 will be explained with reference to FIG. 4 to FIG. 7.

Figure 4:
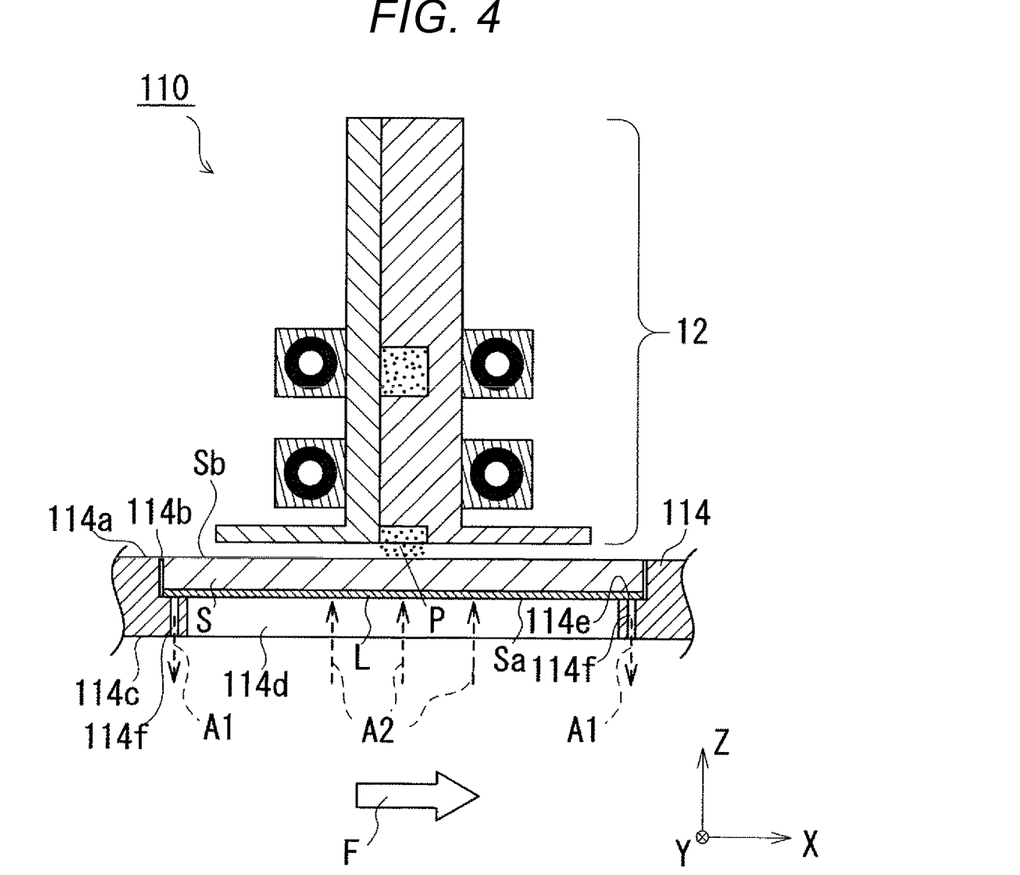
FIG. 4 is a schematic view of a semiconductor manufacturing apparatus according to Embodiment 2.

FIG. 4 schematically shows a semiconductor manufacturing apparatus 110 according to Embodiment 2. A plasma generating apparatus in the semiconductor manufacturing apparatus 110 is the same as the plasma torch unit 12 of the above Embodiment 1. The present embodiment differs from the above Embodiment 1 in a substrate holder. Therefore, a substrate holder according to Embodiment 2 will be explained.

As shown in FIG. 4, a substrate holder 114 of the semiconductor manufacturing apparatus 110 according to Embodiment 2 differs from the substrate holder 14 of Embodiment 1 in a point that a chuck mechanism for fixing the substrate S to the substrate holder 114 is provided.

Specifically, the substrate S is housed inside a concave portion 114b formed in a surface 114a of the substrate holder 114 facing the plasma torch unit 12, a peripheral portion of the first surface Sa of the substrate S is supported by a shoulder portion 114e formed between the concave portion 114b and a through hole 114d. In order to maintain the contact between the shoulder portion 114e and the peripheral portion of the first surface Sa of the substrate S, plural suction holes 114f for sucking the peripheral portion of the first surface Sa are formed in the substrate holder 114b as the chuck mechanism. Openings of the plural suction holes 114f are formed in the shoulder portion 114e. A negative pressure A1 is continued to be given to the suction holes 114f by a vacuum pump (not shown), thereby fixing the peripheral portion of the first surface Sa of the substrate S to the shoulder portion 114e of the substrate holder 114.

In order to suppress the bending to a lower direction due to an own weight of a portion of the first surface Sa of the substrate S not supported by the substrate holder 114 (namely, a central portion other than the peripheral portion contacting the shoulder portion 114e of the substrate holder 114), a positive pressure A2 is given to the portion through the through hole 114d of the substrate holder 114 by, for example, a positive pressure pump (not shown). For example, the positive pressure A2 is continued to be given to the central portion of the first surface Sa of the substrate S so that a bending amount to the lower direction due to the own weight in the center of the substrate S becomes 10 μm or less.

Figure 5:
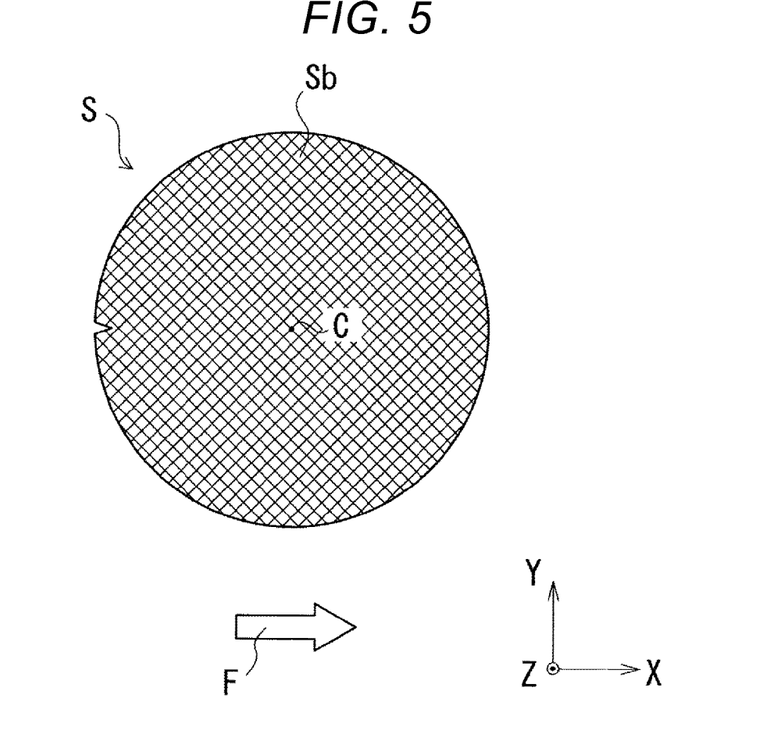
FIG. 5 is a view showing a temperature distribution of a substrate which has been thermally treated by the semiconductor manufacturing apparatus according to Embodiment 2.

A temperature distribution of the substrate S obtained when the plasma processing (thermal treatment) is performed while suppressing the bending to the lower portion due to the own weight in the central portion of the substrate S not supported by the substrate holder 114 is shown in FIG. 5. As shown in FIG. 5, when the thermal treatment is executed while suppressing the bending in the central portion of the substrate S, the second surface Sb is scanned with the plasma P in a state where a distance between the plasma torch unit 12 and the second surface Sb of the substrate S is maintained to be constant. Accordingly, the temperature distribution obtained after the plasma processing is almost uniform over the entire substrate S (the temperature distribution is shown by a cross hatching).

Figure 6:
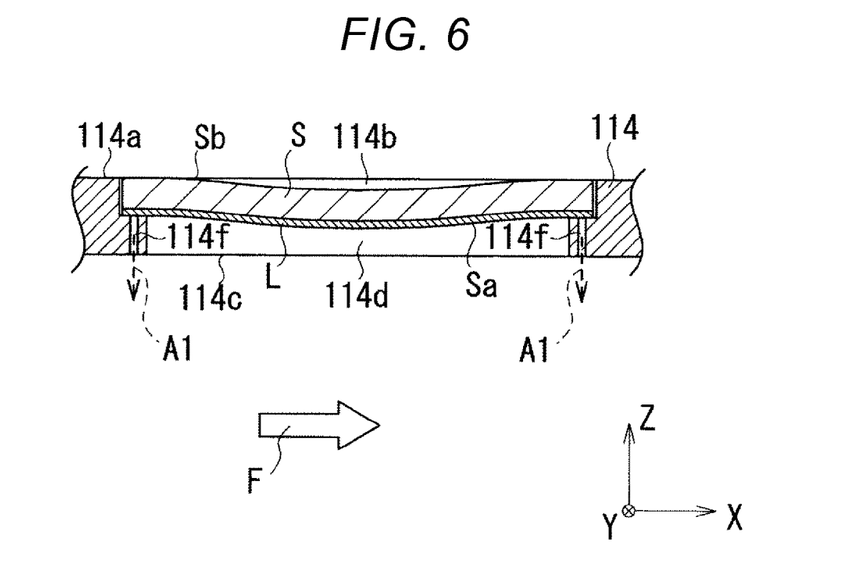
FIG. 6 is a view showing the bending of a substrate due to an own weight in a semiconductor manufacturing apparatus according to a comparative example.
Figure 7:
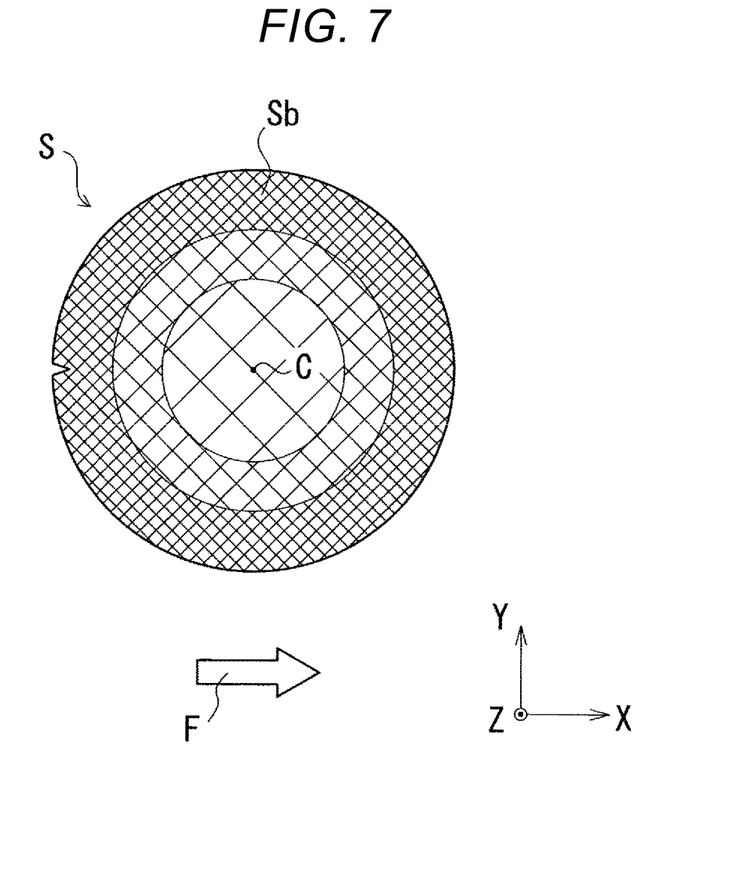
FIG. 7 is a view showing a temperature distribution of the substrate which has been thermally treated by the semiconductor manufacturing apparatus according to the comparative example.

On the other hand, in the case where the positive pressure A2 is not given to the central portion of the substrate S not supported by the substrate holder 114 as shown in FIG. 6, the central portion of the substrate S bends in the lower direction by the own weight. A temperature distribution of the substrate S obtained after the plasma processing (thermal treatment) in this case is shown in FIG. 7.

In the case where the positive pressure A2 is not given to the central portion of the substrate S not supported by the substrate holder 114, the distance between the plasma torch unit 12 and the substrate S is increased as coming close to the center C of the substrate S. Accordingly, the temperature is decreased after the plasma processing as coming close to the center C of the substrate S as shown in FIG. 7 (the temperature distribution is shown by plural cross hatchings, which indicates that the temperature is increased as the density of cross hatchings is increased). Accordingly, different temperatures are distributed concentrically in the substrate S as shown in FIG. 7.

When the heating temperature of the substrate S differs according to places, semiconductor devices to which the annealing process has been sufficiently performed and semiconductor devices to which the annealing process has been insufficiently performed are fabricated. That is, defective semiconductor devices are fabricated.

According to Embodiment 2, it is possible to suppress the damage to the semiconductor devices caused by the electromagnetic fields when the plasma P is generated by the electromagnetic fields and the annealing process is executed to the semiconductor devices on the substrate S by using the plasma P in the same manner as Embodiment 1. As the entire substrate S is uniformly heated, occurrence of defective semiconductor devices can be suppressed.

As shown in FIG. 4, the peripheral portion of the first surface Sa of the substrate S is sucked by the negative pressure A1, therefore, the substrate S is not moved when the positive pressure A2 is given to the central portion of the substrate S. However, it is not necessary to suck the peripheral portion of the first surface Sa of the substrate S by the negative pressure as long as the substrate S is not moved and is continued to be housed in the concave portion of the substrate holder when the positive pressure A2 is given to the central portion of the substrate S due to the difference of a material of the substrate S and so on.

Embodiment 3

Embodiment 3 will be explained with reference to FIG. 8.

Figure 8:
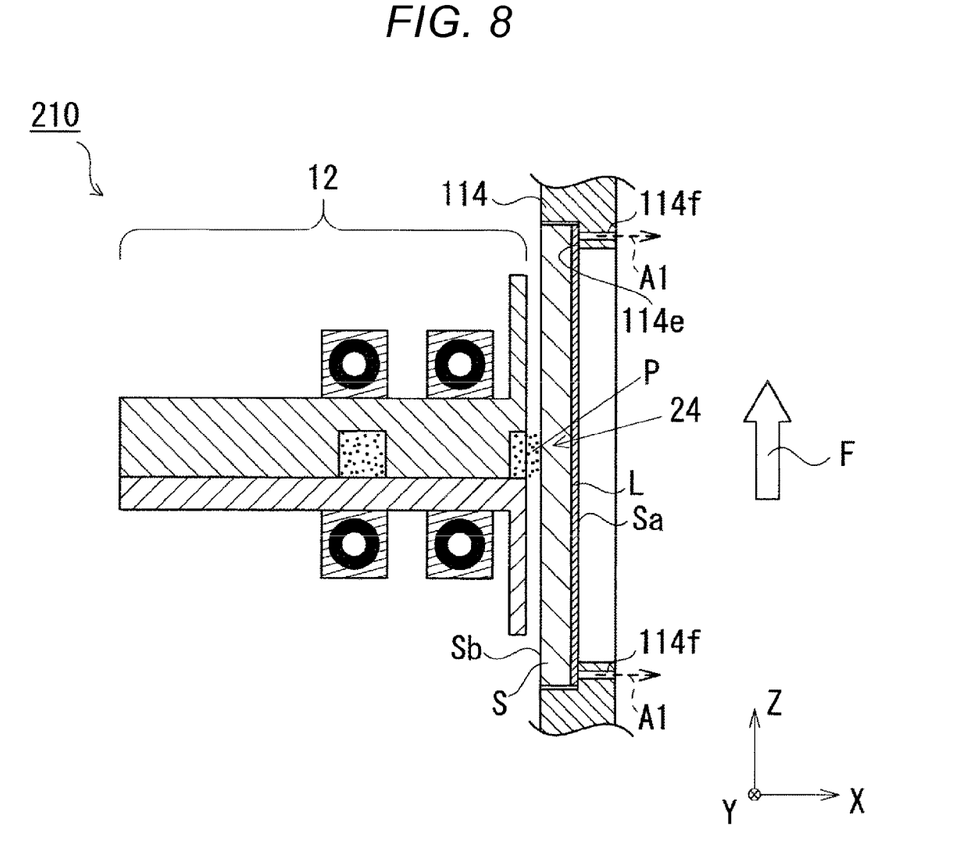
FIG. 8 is a schematic view of a semiconductor manufacturing apparatus according to Embodiment 3.

FIG. 8 schematically shows a semiconductor manufacturing apparatus 210 according to Embodiment 3. A structure of a plasma generating apparatus in the semiconductor manufacturing apparatus 210 is the same as the structure of the plasma torch unit 12 of the above Embodiment 1. A structure of a substrate holder in the semiconductor manufacturing apparatus 210 is the same as the structure of the substrate holder 114 of the above Embodiment 2.

As shown in FIG. 1 and FIG. 4, the respective plasma torch units 12 and the substrates S in the semiconductor manufacturing apparatus 10 of the above Embodiment 1 and the semiconductor manufacturing apparatus 110 of the above Embodiment 2 face each other in a vertical direction (Z-axis direction). The plasma torch unit 12 of the semiconductor manufacturing apparatus 210 of Embodiment 3 differs from the above, which faces the substrate S in a horizontal direction (X-axis direction) as shown in FIG. 8.

Accordingly, the plasma torch unit 12 is in a posture in which the opening 24 faces the horizontal direction (X-axis direction). On the other hand, the substrate holder 114 holding the substrate S is arranged relatively to the plasma torch unit 12 so that a normal line of the second surface Sb of the substrate S extends in the horizontal direction (X-axis direction) as well as so that the second surface Sb faces the plasma torch unit 12. In the case of Embodiment 3, the substrate holder 114 moves in the vertical direction (Z-axis direction).

According to the above semiconductor manufacturing apparatus 210, it is possible to suppress the bending of the central portion of the substrate S not supported by the substrate holder 114 due to the own weight so as to be apart from the opening 24 of the plasma torch unit 12. That is, the distance between the second surface Sb of the substrate S and the plasma torch unit 12 is maintained to be constant while the substrate holder 114 (substrate 5) moves in the vertical direction. Accordingly, the entire substrate S is uniformly heated, which suppresses the occurrence of defective semiconductor devices due to the insufficient annealing process.

According to Embodiment 3, it is possible to suppress the damage to the semiconductor devices caused by the electromagnetic fields when the plasma P is generated by the electromagnetic fields and the annealing process is executed to the semiconductor devices on the substrate S by using the plasma P in the same manner as Embodiment 2. As the entire substrate S is uniformly heated, occurrence of defective semiconductor devices can be suppressed.

In the case of Embodiment 3, the substrate holder 114 moves relatively to the plasma torch unit 12 in the vertical direction (Z-axis direction). It is also preferable, instead of the above, that the substrate holder 114 moves in the horizontal direction (Y-axis direction) which is orthogonal to a direction in which the substrate holder 114 faces the plasma torch unit 12 (X-axis direction). In a broad sense, the substrate holder 114 may move relatively to the plasma torch unit 12 in a state where a normal line of the second surface Sb of the substrate S to be irradiated with the plasma P extends in the horizontal direction so that the substrate S moves in the direction orthogonal to the normal line.

The semiconductor manufacturing apparatus and method have been explained by citing plural Embodiments 1 to 3, however, the semiconductor manufacturing apparatus and method are not limited to these embodiments.

For example, in the case of the above Embodiment 2, the positive pressure A2 is given to the central portion of the first surface Sa of the substrate S not supported by the substrate holder 114 so that the portion does not bend in the lower direction due to the own weight as shown in FIG. 4. As a result, the distance between the second surface Sb of the substrate S and the plasma torch unit 12 is maintained to be constant. It is also preferable, instead of the above, that the plasma torch unit 12 moves vertically so that the distance between the second surface Sb of the substrate S and the plasma torch unit 12 is maintained to be constant. In this case, the bending amount of the substrate S is measured and the distance between the plasma torch unit 12 and the substrate S is controlled based on the measured results of the bending amount.

It is also preferable, for example, that the temperature of the substrate S during the plasma processing (thermal treatment) is measured and the plasma processing is controlled based on the measured results of the temperature for further suppressing heating unevenness by the plasma P, that is, so that the heating temperature distribution of the entire substrate S becomes further uniform. For example, it is preferable that an ultrasonic vibrator is installed in the plasma torch unit 12 and the plasma torch unit 12 is vibrated at high speed by using the ultrasonic vibrator based on the measured results of the temperature of the substrate S. It is also preferable, for example, that the distance between the plasma torch unit 12 and the substrate S is changed based on the measured results of the temperature of the substrate S. It is further preferable, for example, that the plasma density is changed by changing a plasma gas flow amount to be supplied to the chamber 22 of the plasma torch unit 12.

Figure 9:
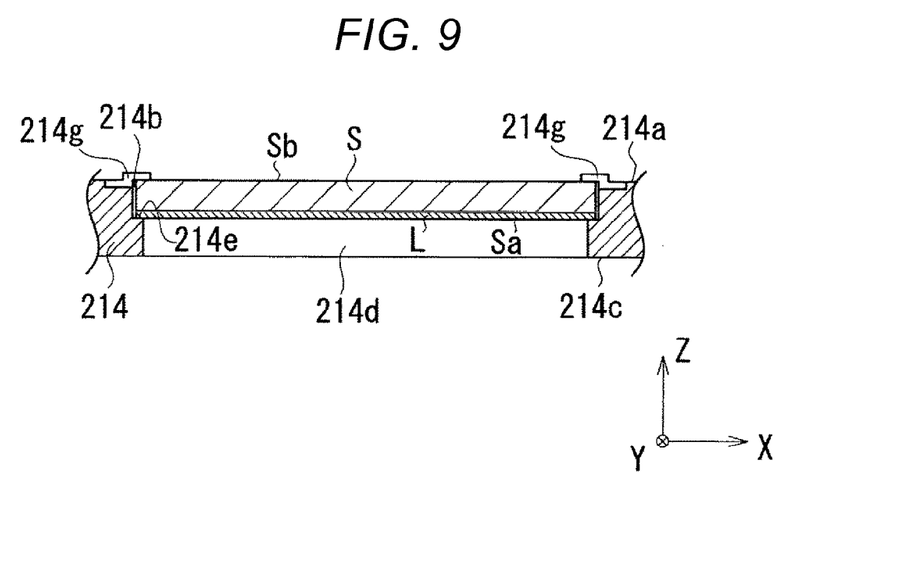
FIG. 9 is a cross-sectional view showing a chuck mechanism of a substrate in a semiconductor manufacturing apparatus according to another embodiment.

Furthermore, the chuck mechanism in which the peripheral portion of the first surface Sa of the substrate S is sucked by the negative pressure is applied in the case of Embodiment 2, however, the present invention is not limited to this. For example, as shown in FIG. 9, the chuck mechanism may be formed of plural chuck claws 214g partially abutting on the peripheral portion of the second surface Sb of the substrate S irradiated with the plasma P to fix the substrate S to the substrate holder. The substrate S is sandwiched between the plural chuck claws 214g and a shoulder portion 214e of a substrate holder 214 in a thickness direction of the substrate S.

As the plural chuck claws 214g of the chuck mechanism abut on the second surface Sb of the substrate S as shown in FIG. 9, the chuck claws 214g protrude from a surface 214a of the substrate holder 214. Accordingly, the plural chuck claws 214g affect the plasma P used for scanning the second surface Sb of the substrate S and the surface 214a of the substrate holder 214 (for example, the plasma P fluctuates). It is preferable that a protruding amount of the plural chuck claws 214g from the surface 214a of the substrate holder 214 is reduced as small as possible for reducing the effects on the plasma P as small as possible.

Figure 10:
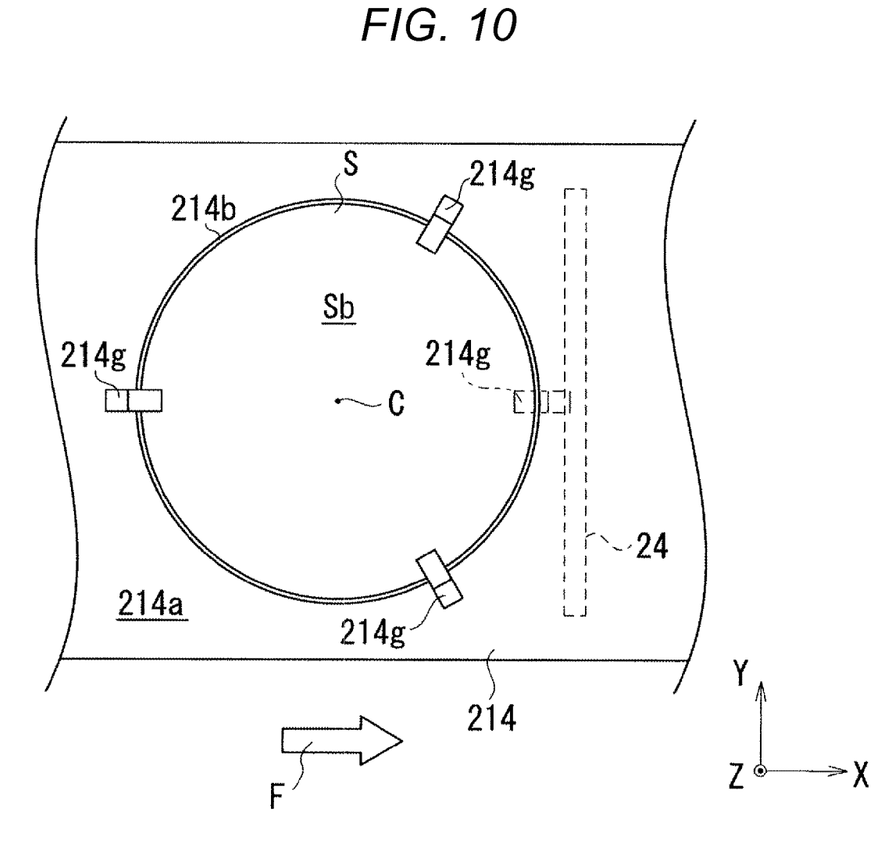
FIG. 10 is an upper surface view showing a chuck mechanism of a substrate as an example in a semiconductor manufacturing apparatus according to another embodiment.
Figure 11:
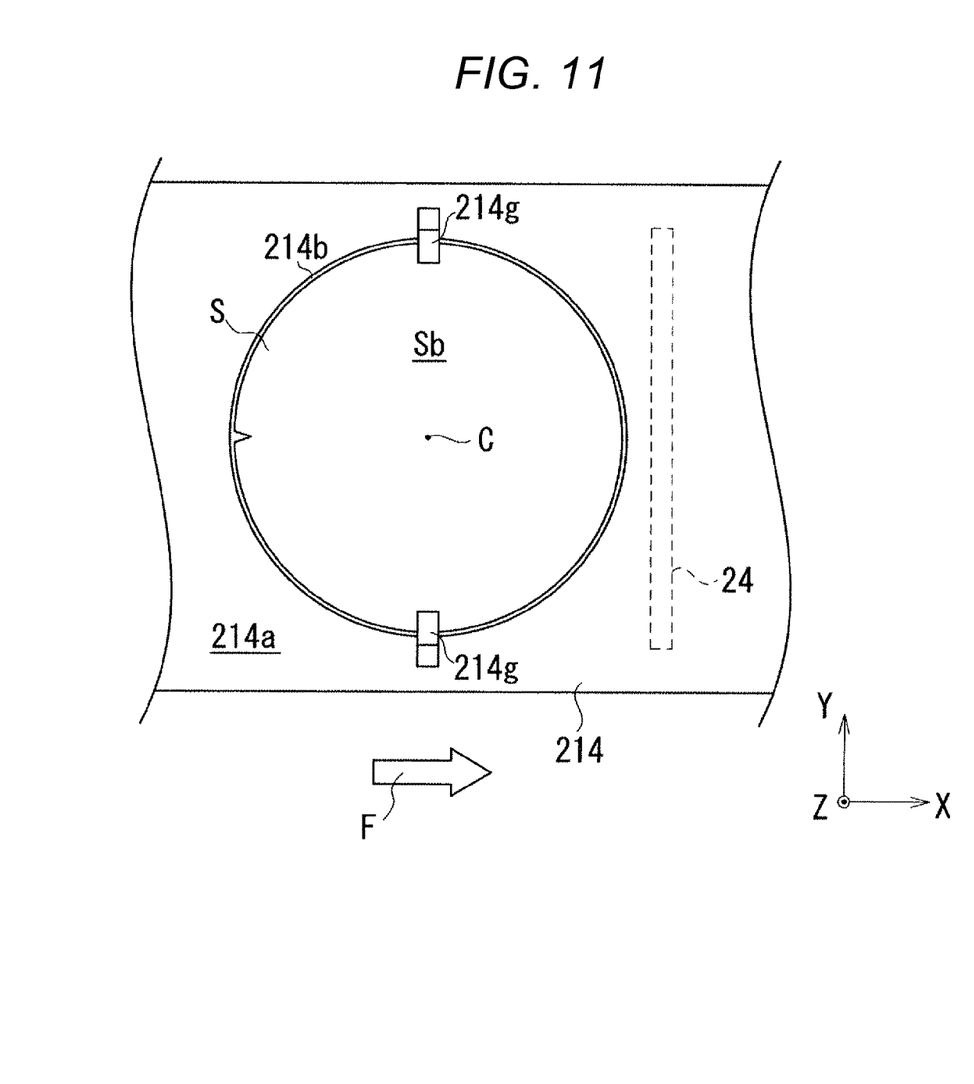
FIG. 11 is an upper surface view showing a chuck mechanism of the substrate as another example in the semiconductor manufacturing apparatus according to another embodiment.

Furthermore, as shown in FIG. 10 and FIG. 11, it is preferable that plural chuck claws 214g are provided and a contact area between the plural chuck claws 214g and the substrate S is reduced as small as possible for reducing the effects on the plasma P used for scanning the surface 214a of the substrate holder 214 and the second surface Sb of the substrate S. It is also preferable that the plural chuck claws 214g are provided in the substrate holder 214 so that the chuck claws 214g do not contact the front portion of the second surface Sb of the substrate S in the feeding direction F of the substrate holder 214 as far as possible.

For example, in the case where one chuck claw 214g abuts on the peripheral portion of the second surface Sb of the substrate S, when the plasma P passes (climbs over) the front portion of one chuck claw 214g in the feeding direction F, the plasma P is started to fluctuate, as a result, the second surface Sb of the substrate S is scanned with the plasma P in a fluctuating state. Moreover, for example, in the case where the chuck claw 214g abutting on a portion of the second surface Sb of the substrate S which passes the front portion (lower portion) of the opening 24 of the plasma torch unit 12 irradiating the plasma P first (namely, a chuck claw 214g' shown by a double-chain line in FIG. 10) exists, a portion of the plasma P which has passed the chuck claw 214g' fluctuates, and a portion of the second surface Sb of the substrate S following the chuck claw 214g' is scanned with the plasma P in the fluctuating state. When the second surface Sb of the substrate S is scanned with the plasma P in the fluctuating state, heating unevenness occurs in the substrate S.

Furthermore, the substrate S is the silicon wafer which is often used in the semiconductor manufacturing processes in the above embodiments, however, the apparatus and method limited to a silicon wafer. The substrate S can be, for example, wafers made of gallium nitride (GaN), silicon carbide (SiC), gallium arsenide (GaAs) and so on. That is, the substrate according to the embodiments is the substrate, in a broad sense, capable of executing the annealing process to devices formed on the first surface by irradiating the second surface with the plasma, which is the opposite side of the first surface on which devices (devices requiring the annealing process) are formed. A thickness of the substrate for realizing the above is, for example, 1 mm or less. The substrate is also the substrate in which electric current flows on the surface thereof by electromagnetic fields and eddy current is generated accordingly, as a result, the substrate can function as the electromagnetic shield.

Additionally, in the above embodiments, the plasma generating apparatus for generating plasma is an inductively-coupled plasma torch unit which generates plasma by allowing electromagnetic fields formed by coils to act on the plasma gas, however, the apparatus is not limited to this. The plasma generating apparatus according may be, in a broad sense, the plasma generating apparatus which generates plasma by allowing electromagnetic fields to act on the plasma gas. The second surface of the substrate which is the opposite side of the first surface of the substrate on which devices are formed faces the above plasma generating apparatus, and the second surface is irradiated with the plasma generated by the plasma generating apparatus.

As described above, it is possible to perform thermal treatment by using plasma without electrostatically damaging the devices formed on the substrate according to the various embodiments. Therefore, the apparatus and method can be applied to the manufacture of semiconductors irrespective of an integrated circuit or a discrete device. The apparatus and method can be also applied to not only the manufacture of a mono-elemental semiconductor of silicon or the like but also the manufacture of compound semiconductors, the manufacture of MEMS including the annealing process and so on.

What is claimed is:

1. A semiconductor manufacturing method performing thermal treatment of a substrate by using plasma while moving the substrate on which devices are formed relatively to a plasma generating apparatus which generates the plasma by allowing electromagnetic fields to act on a plasma gas, comprising:

irradiating a second surface of the substrate with the plasma in a state where the second surface of the substrate which is the opposite side of a first surface of the substrate on which the devices are formed faces the plasma generating apparatus.

2. The semiconductor manufacturing method according to claim 1, wherein the second surface of the substrate which faces upward is irradiated with the plasma while moving the substrate relatively to the plasma generating apparatus in a state where bending to a lower direction due to an own weight of the substrate is suppressed by giving a positive pressure to the first surface facing downward.

3. The semiconductor manufacturing method according to claim 1, wherein the second surface of the substrate is irradiated with the plasma while moving the substrate relatively to the plasma processing apparatus in a state where a normal line of the second surface of the substrate extends in a horizontal direction.

4. The semiconductor manufacturing method according to claim 1, wherein the plasma is irradiated in a line shape onto the second surface of the substrate from an opening of the plasma generating apparatus a longitudinal direction of which is parallel to the second surface of the substrate to be irradiated with plasma and orthogonal to a relative movement direction of the substrate as well as longer than a size of the substrate in a direction orthogonal to the relative movement direction.

5. A semiconductor manufacturing apparatus performing thermal treatment of a substrate on which semiconductor devices are formed with plasma, comprising:
- a plasma generating apparatus which generates the plasma by allowing electromagnetic fields to act on a plasma gas;
- a substrate holder which holds the substrate; and
- a movement mechanism which moves the substrate holder,
- wherein a second surface of the substrate is irradiated with the plasma while moving the substrate holder relatively to the plasma generating apparatus by the movement mechanism so that a normal line of the second surface of the substrate which is the opposite side of a first surface of the substrate on which the semiconductor devices are formed extends in a horizontal direction as well as the second surface faces the plasma generating apparatus.

\* \* \* \* \*